United States Patent [19]

Hayashi et al.

[11] Patent Number: 5,426,654
[45] Date of Patent: Jun. 20, 1995

[54] CHANNEL DATA CRC SYSTEMS FOR USE WITH CROSS CONNECT EQUIPMENT

[75] Inventors: Toshiaki Hayashi, Osaka; Hiroshi Nakaide, Kawasaki; Shinzi Hiyama, Kawasaki; Satoshi Takeda, Kawasaki; Masashi Ohba, Kawasaki, all of Japan

[73] Assignee: Fujitsu Limited, Kawasaki, Japan

[21] Appl. No.: 985,624

[22] Filed: Dec. 3, 1992

[30] Foreign Application Priority Data

Dec. 3, 1991 [JP] Japan .................................. 3-318272

[51] Int. Cl.$^6$ .............................................. G06F 11/12
[52] U.S. Cl. ............................................... 371/37.1
[58] Field of Search ...................... 371/37.1, 68.2, 37.7

[56] References Cited

U.S. PATENT DOCUMENTS 4,532,517  7/1985  LaBerge et al. ...................... 343/372
4,720,830  1/1988  Joshi et al. .............................. 371/37
5,130,991  7/1992  Taskano ............................... 371/37.6

Primary Examiner—Hoa T. Nguyen

[57] ABSTRACT

At a CRC transmission side of a cross connect equipment, a CRC operation is applied to received channel data of each channel independently and sequentially in every sub frame having the same number of channels, series of which sub frames set up a main frame. The resultant CRC code of each channel obtained in a preceding sub frame is coupled to the received channel data of the corresponding channel to apply the same CRC operation to the thus received channel data, thereby the accumulated result of each channel is added in the last sub frame. At a CRC reception side, a cyclic CRC operation similar to that achieved at the CRC transmission side is applied to an outgoing channel data provided with the resultant CRC codes for each channel to obtain CRC results. During the cyclic CRC operation, a CRC error that once occurs is held during the main frame.

11 Claims, 14 Drawing Sheets

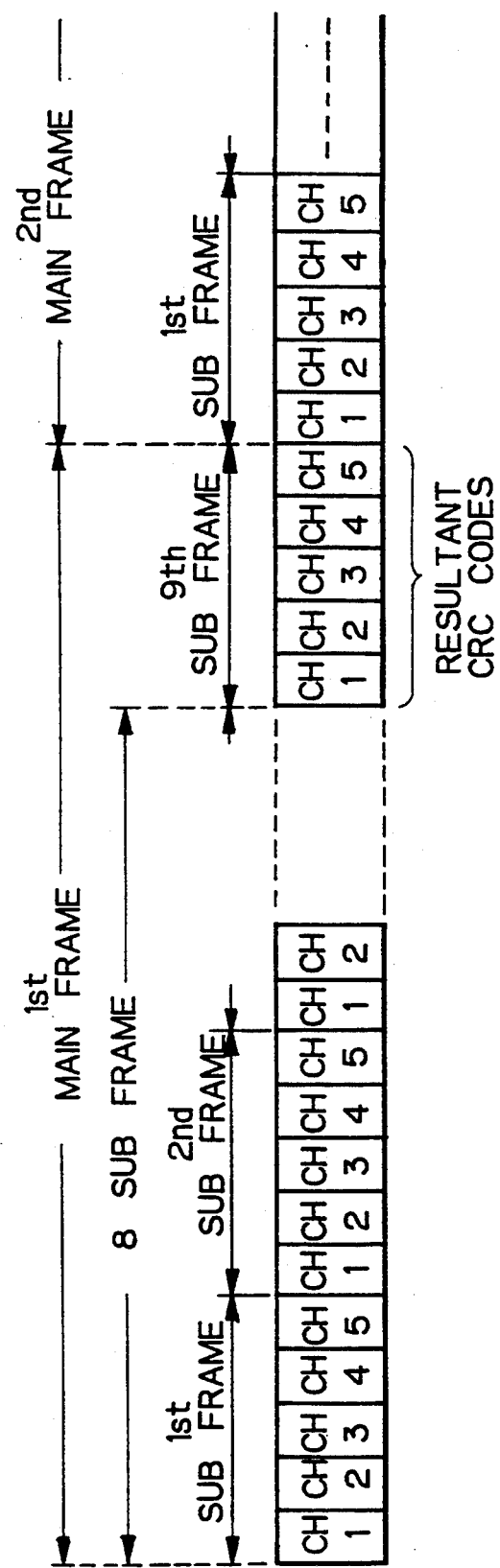

CHANNEL DATA CRC SYSTEMS FOR USE WITH CROSS CONNECT EQUIPMENT

BACKGROUND OF THE INVENTION

1. Field of the Invention

The present invention relates to a Cyclic Redundancy Check (CRC) system applied to channel data transferred from an incoming side of a cross connect equipment to an outgoing side thereof.

Under the CRC system, a division arithmetic operation by a certain generator polynominal is achieved with respect to an incoming channel data to seek a remainder. The sought remainder is added to the incoming channel data to be input to the cross connect equipment. At the outgoing side of the cross connect equipment, the outgoing channel data provided with the remainder is divided by the same generator polynominal as used at the incoming side to seek a remainder. If the remainder is zero, it is found that the related CRC result is good, i.e., no CRC error exists. Contrary to the above, if the remainder is not zero, it is found that the related CRC result is bad, i.e., some CRC error exists. That is, some data error has occurred in the transferred channel data.

2. Description of the Related Art

As will be clarified hereinafter, at the incoming side of the cross connect system, the conventional CRC operations are carried out for the data of each channel separately by using a plurality of CRC apparatuses allotted to respective channels to produce the aforesaid remainders, i.e., resultant CRC codes. Similarly, at the outgoing side of the cross connect system, a plurality of CRC apparatuses are prepared to obtain the CRC results for each channel separately.

As apparent from the above, in the cross connect system, the hardware for performing the CRC operations becomes extremely large in size and the CRC system becomes expensive accordingly.

SUMMARY OF THE INVENTION

Therefore, the present invention, in view of the above problem, has as its object the provision of a CRC system applied to the cross connect equipment, which CRC system can be realized with small hardware, and thus, at very low cost.

To attain the above object, in the present invention, at a CRC transmission side of a cross connect equipment, a CRC operation is applied to received channel data of each channel independently and sequentially in every sub frame having the same number of channels, a series of which sub frames set up a main frame. The resultant CRC code of each channel obtained in a preceding sub frame is coupled to the received channel data of the corresponding channel to apply the same CRC operation to the thus received channel data, and thereby the accumulated result of each channel is added in the last frame. At a CRC reception side, a cyclic CRC operation similar to that achieved at the CRC transmission side is applied to an outgoing channel data provided with the resultant CRC codes for each channel to obtain CRC results. During the cyclic CRC operation, a CRC error that has once occurred is held during the main frame.

BRIEF DESCRIPTION OF THE DRAWINGS

The above object and features of the present invention will be more apparent from the following description of the preferred embodiments with reference to the accompanying drawings, wherein:

FIGS. 9A, 9B, 9C and 9D depict signal formats for explaining the operation achieved in the CRC system of FIG. 8;

DESCRIPTION OF THE PREFERRED EMBODIMENTS

Before describing the embodiments of the present invention, the prior art and the problems therein will be first described with reference to the related figures.

Figure 1:
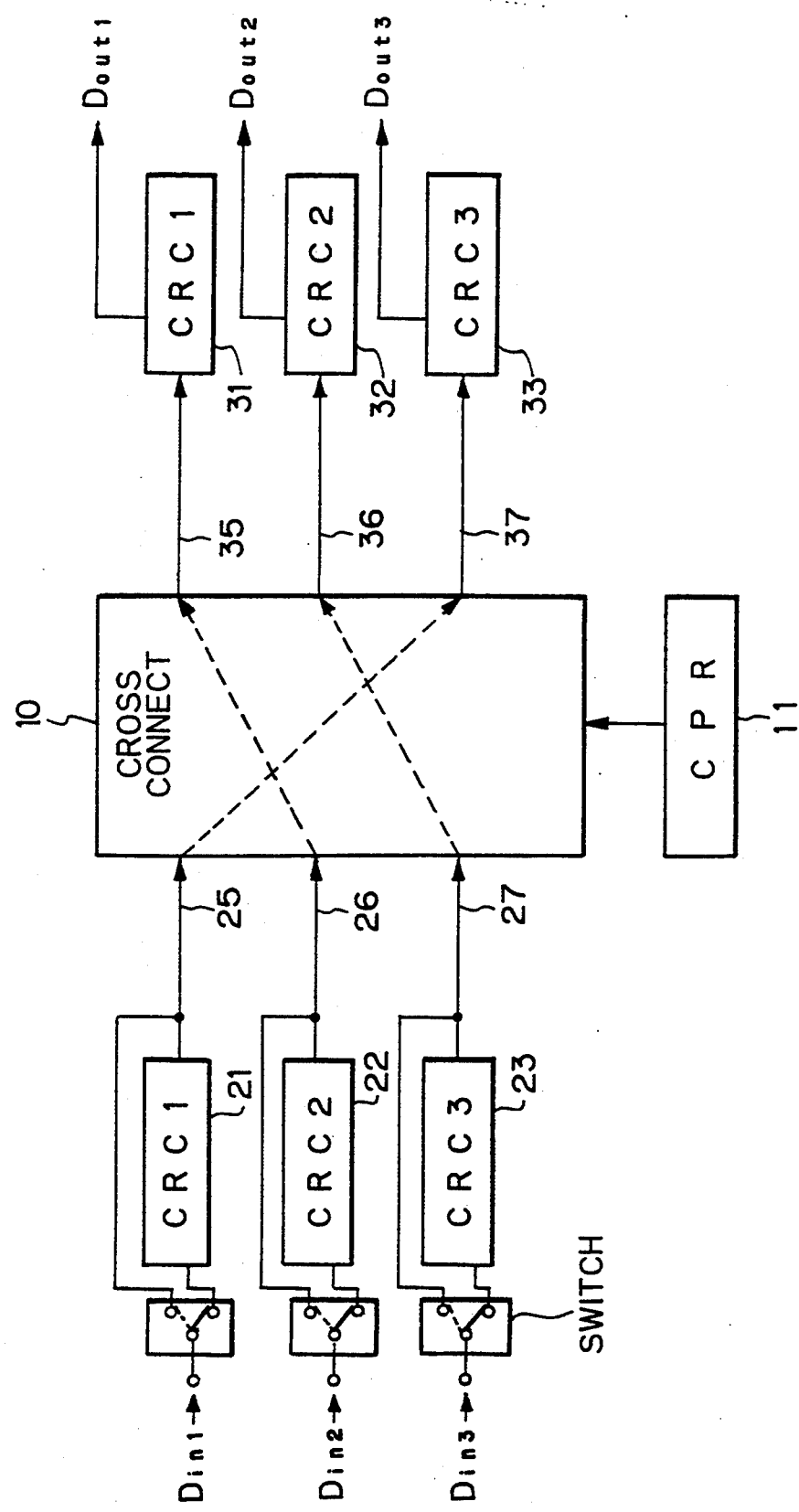
FIG. 1 is a general block diagram of a known cross connect system to which the present invention is applied.

FIG. 1 is a general block diagram of a known cross connect system to which the present invention is applied. A recently-proposed digital transport network called a Synchronous Digital Hierarchy (SDH) employs therein a cross connect equipment 10, as a time-space exchange. The cross connect equipment 10 is provided with, at its input side, a plurality of incoming paths and, at its output side, a plurality of outgoing paths. In the figure, only three incoming paths 25, 26 and 27 and three outgoing paths 35, 36 and 37 are illustrated for brevity.

In order to increase the reliability of the cross connect equipment 10, a known CRC method is applied thereto. For this, CRC transmission units 21, 22 and 23 are introduced at the incoming side and CRC reception units 31, 32 and 33 are introduced at the outgoing side. These units are used only when the CRC test must be used. Therefore, channel data $Din_1$, $Din_2$ and $Din_3$ are bypassed if no such CRC test is required at the units 21, 22 and 23. The same applies to the outgoing side of the cross connect equipment 10. Namely, if no such CRC test is required, the outgoing channel data just passes through respective CRC reception units 31, 32 and 33. Path switching in the equipment can be handled by a Central Processing Unit (CPR) 11 to comply with a frame format regulated in the SDH.

Figure 2:
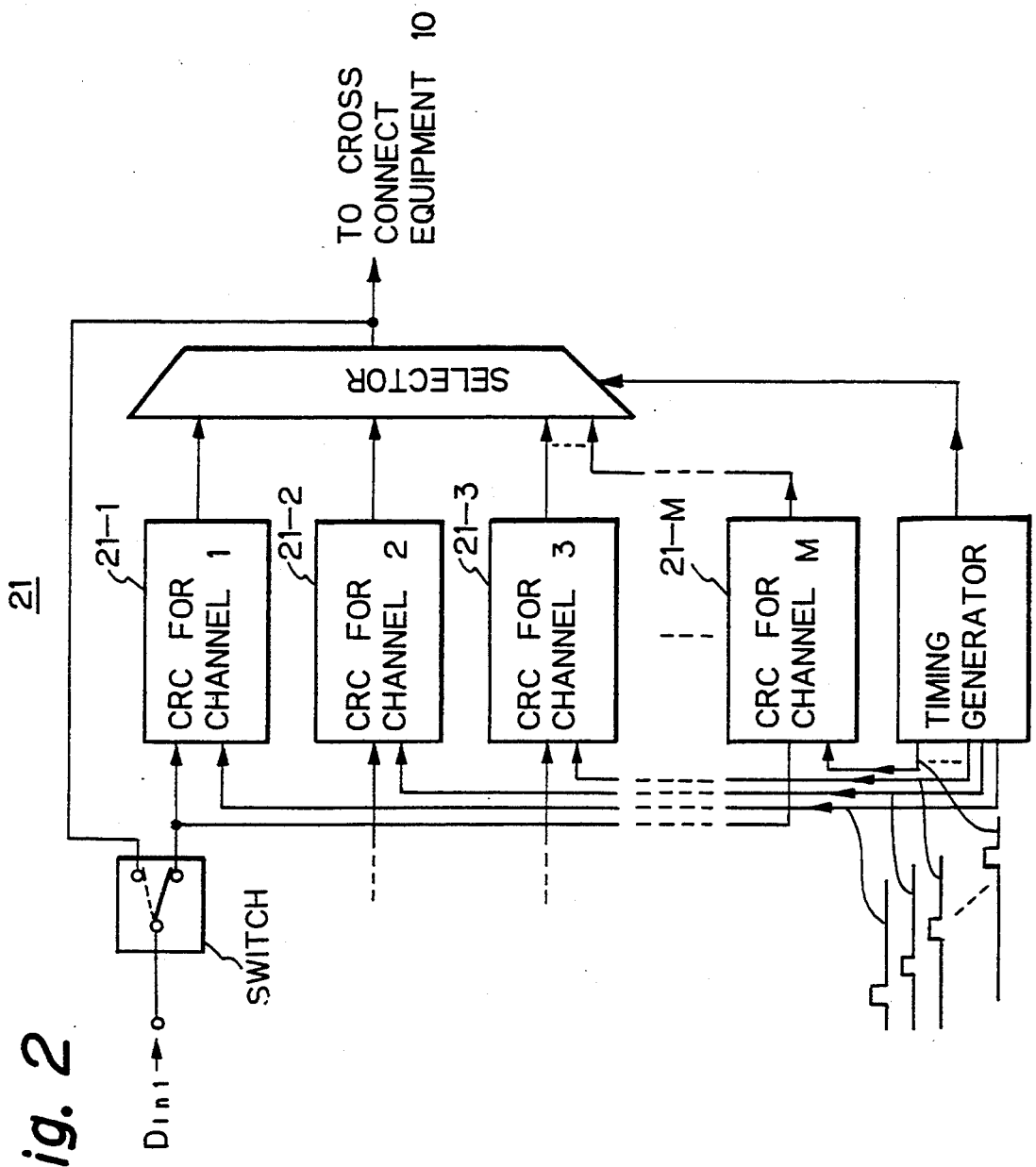
FIG. 2 illustrates an example of a conventional CRC transmission unit.

FIG. 2 illustrates an example of a conventional CRC transmission unit. It should be understood here that each conventional CRC reception unit is identical to those shown in FIG. 1. Further, only the CRC transmission unit 21 is taken as representative. As seen from FIG. 2, each of the CRC transmission units (21 to 23) is comprised of a plurality of CRC transmission circuits 21-1 to 21-M for respective M channels in the case that each CRC operation is applied to each successive M channel periodically.

Figure 3:
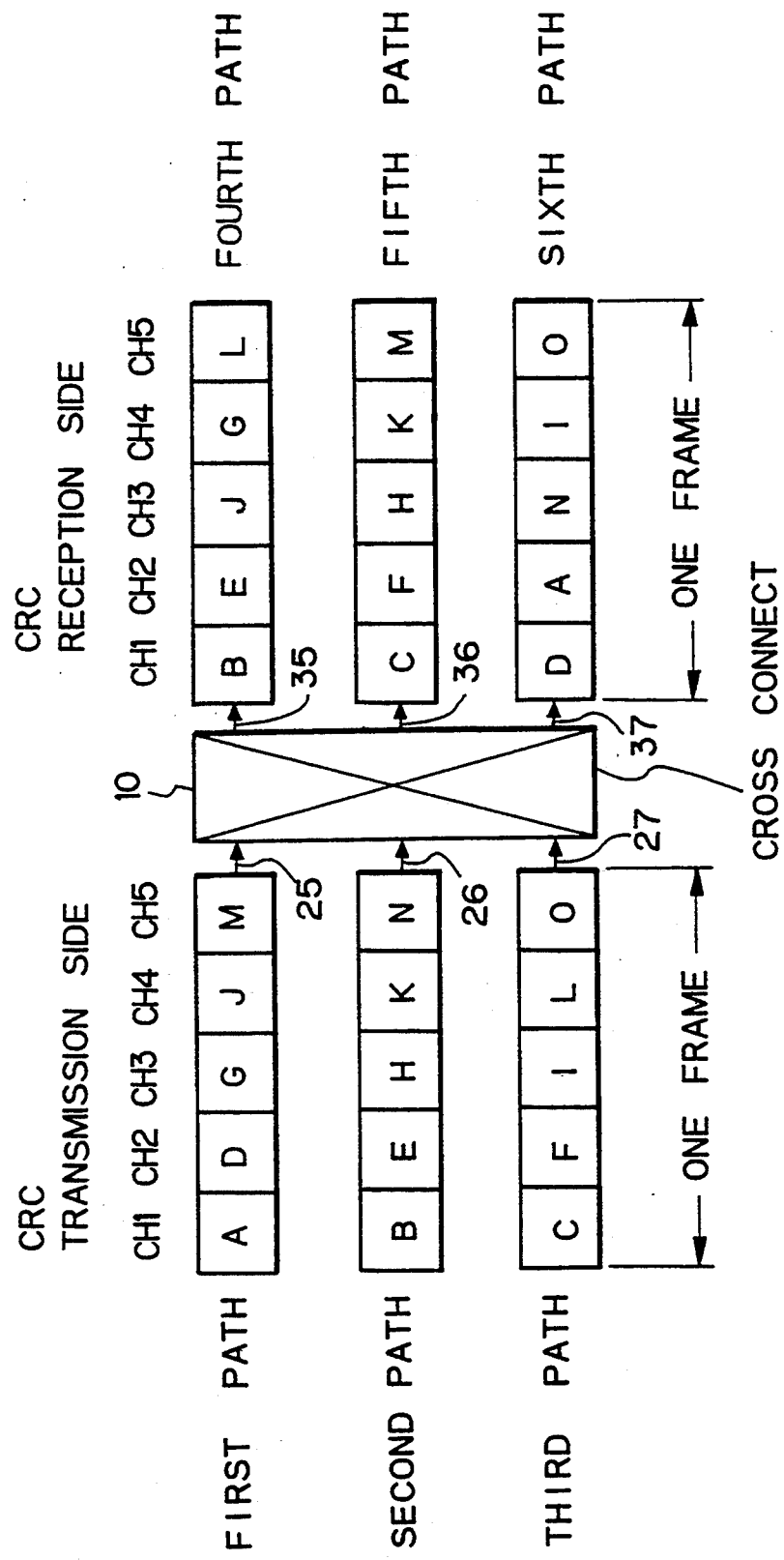
FIG. 3 depicts data arrangements, as an example, at the incoming side and the outgoing side of FIG. 1.

FIG. 3 depicts data arrangements, as an example, at the incoming side and the outgoing side of FIG. 1. It is assumed here that, as an example, three incoming paths 25 to 27 and three outgoing paths 35 to 37 exist and each path transfers channel data set up with a series of frames each composed of five channels CH1 to CH5, as shown in FIG. 3. The channels CH1 to CH5 of the first path carry channel data A, D, G, J and M, respectively, the channels CH1 to CH5 of the second path carry channel data B, E, H, K and N, respectively, the channels CH1 to CH5 of the third path carry channel data C, F, I, L and O, respectively, the channels CH1 to CH5 of the fourth path carry channel data B, E, J, G and L, respectively, the channels CH1 to CH5 of the fifth path carry channel data C, F, H, K and M, respectively, and the channels CH1 to CH5 of the sixth path carry channel data D, A, N, I and O, respectively.

When achieving the CRC test with respect to the above channel data, the CRC transmission unit 21 must use the same number of the transmission circuits 21-1, 21-2 . . . 21-M (M=5) (refer to FIG. 2). The same applies to the CRC transmission units 22 and 23 and the CRC reception units 31, 32 and 33. Taking the first path as an example, the channel data A at the channel CH1 is to be exchanged with the channel CH2 in the sixth path, which path setting is known beforehand by the CPR 11. Therefore, the CRC operation should be carried out between the CRC transmission circuit 21-1 and a CRC reception circuit (33-2) of the CRC reception unit 33 to obtain the CRC result.

However, such a construction of the conventional CRC system produces the aforementioned problem, i.e., the hardware thereof becomes large and accordingly expensive. For example, in FIG. 3, fifteen CRC transmission circuits and fifteen CRC reception circuits are needed, where the number "fifteen" is derived from 3 paths×5 channels.

Figure 4:
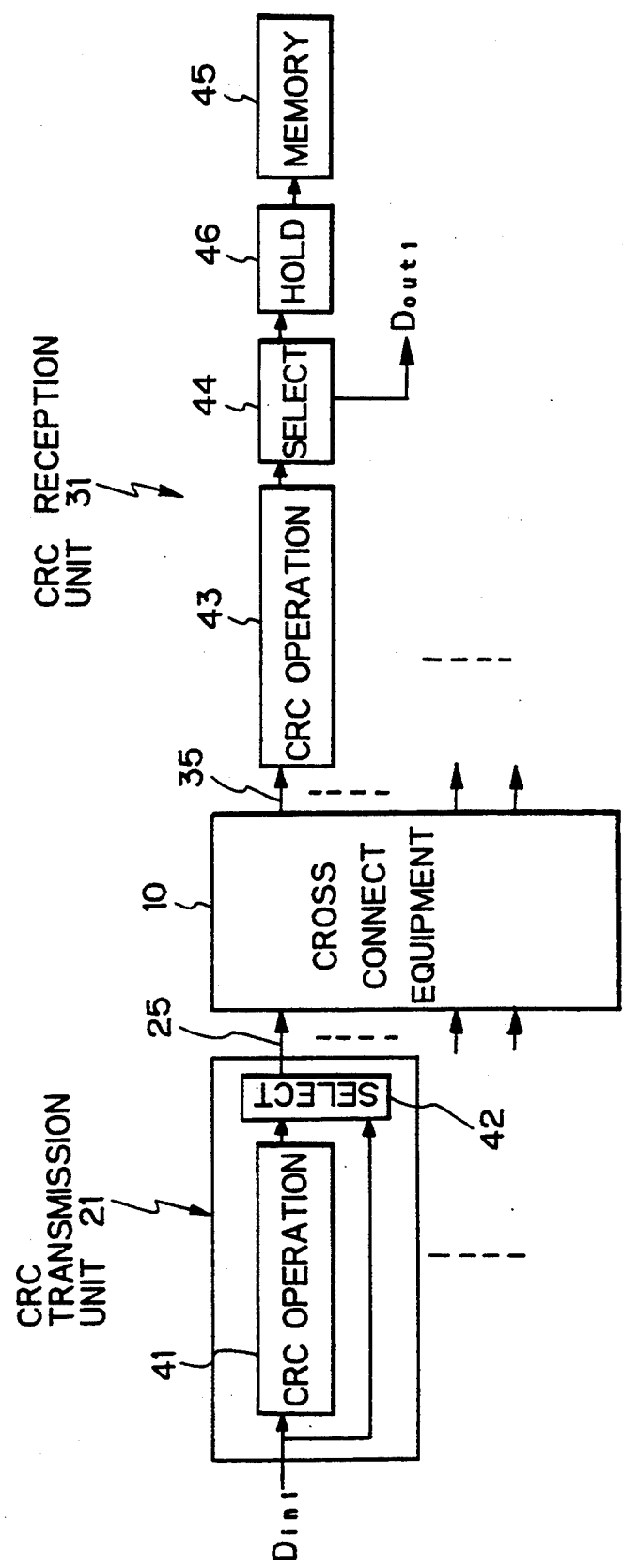
FIG. 4 is a general block diagram of a CRC system according to the present invention.

FIG. 4 is a general block diagram of a CRC system according to the present invention. In conclusion, according to the present invention, a single CRC transmission circuit is adequate for each CRC transmission unit (21, 22, 23) and a single CRC reception circuit is adequate for each CRC reception unit (31, 32, 33). In FIG. 4, however, only one pair of the units 21 and 31 are illustrated as an example for simplicity.

The CRC transmission unit 21 of the present invention is mainly comprised of a first means (CRC OPERATION) 41 and a second means (SELECT) 42. On the other hand, the CRC reception unit 31 of the present invention is mainly comprised of a third means (CRC OPERATION) 43, a fourth means (SELECT) 44, a fifth means (MEMORY) 45 and a sixth means (HOLD) 46.

Figure 5:
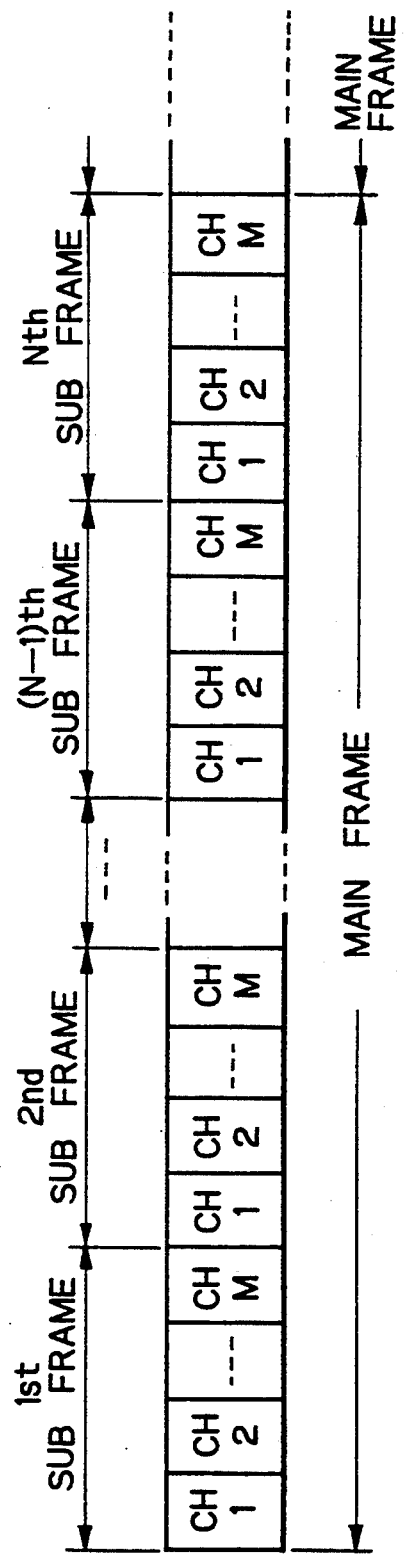
FIG. 5 depicts a frame format of a series of channel data.

At the incoming side, the above mentioned first means 41 operates to receive a series of incoming channel data $Din_1$ to be checked and to apply CRC operations thereto to obtain resultant CRC codes for respective channels independently and repeatedly through N−1 sub frames, each including the same number of channels, such that, in each channel, the resultant CRC code which was produced at the preceding sub frame is coupled to the channel data received at the present sub frame, the CRC operations being carried out in every successive main frame composed of N sub frames, where N is a predetermined positive integer equal to or larger than 2. The above mentioned second means operates to select, during the series of 1st sub frame to (N−1)th sub frame, the respective channel data to input to the cross connect equipment 10 and to select, at the Nth sub frame, the final resultant CRC codes of respective channels, whereby the series of channel data followed by the final resultant CRC codes for each channel are input to the cross connect equipment 10. The above mentioned sub frames and main frame will be clarified by FIG. 5. FIG. 5 depicts a frame format of a series of channel data.

Referring again to FIG. 4, at the outgoing side, the above mentioned third means 43 operates to receive from the cross connect equipment 10 a series of outgoing channel data followed by the aforesaid resultant CRC codes generated in the first means 41 and apply CRC operations thereto to obtain CRC results for respective channels independently and repeatedly through the N sub frames, each including the same number of channels (CH1, CH2 . . . CHM), so that, in each channel, the CRC result which was produced at the preceding sub frame is coupled to the channel data at the present sub frame, the CRC operations being carried out in every successive main frame composed of N sub frames. The above mentioned fourth means 44 operates to select, during the series of 1st sub frame to (N−1)th sub frame, the respective channel data to be externally output as Dout and to select, at the Nth sub frame, the final CRC results of respective channels. The above mentioned fifth means 45 operates to store respective CRC results of each channel. The above mentioned sixth means 46 operates to, once a CRC error is found as the CRC result, hold the CRC error at the corresponding channel in the fifth means (45).

Figure 6:
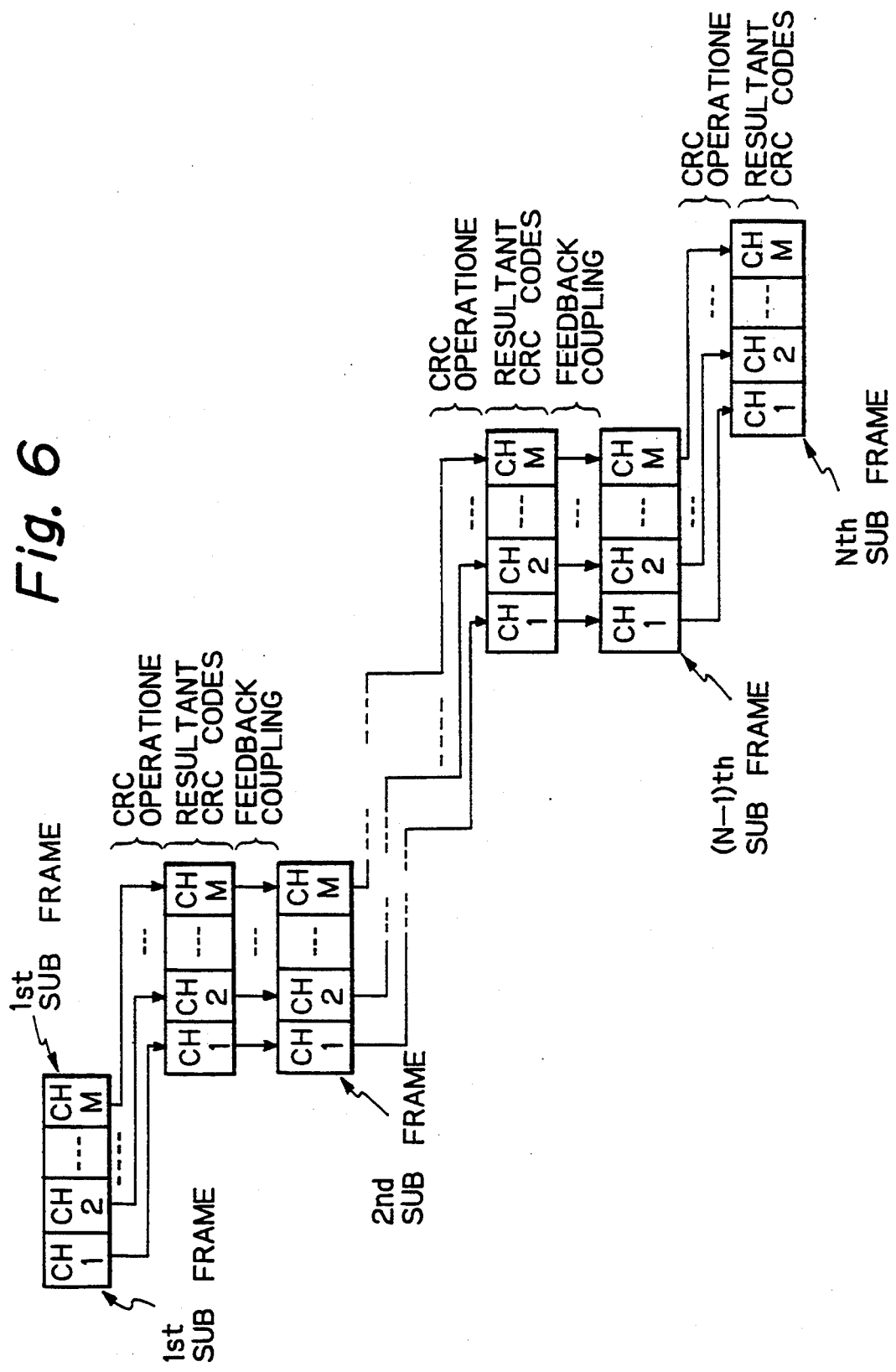
FIG. 6 depicts timing charts for schematically expressing CRC operations achieved according to the present invention.

The CRC operation will be clarified with reference to FIG. 6.

FIG. 6 depicts timing charts for schematically expressing CRC operations achieved according to the present invention. In FIG. 6, the "CRC OPERATION" is achieved by the first means 41 (also the third means 43) and the "FEEDBACK COUPLING" is also performed therein. The accumulated resultant CRC codes are selected and extracted by the second means 42 (also the fourth means 44) and added to the Nth sub frame which is the last sub frame in each main frame.

Figure 7:
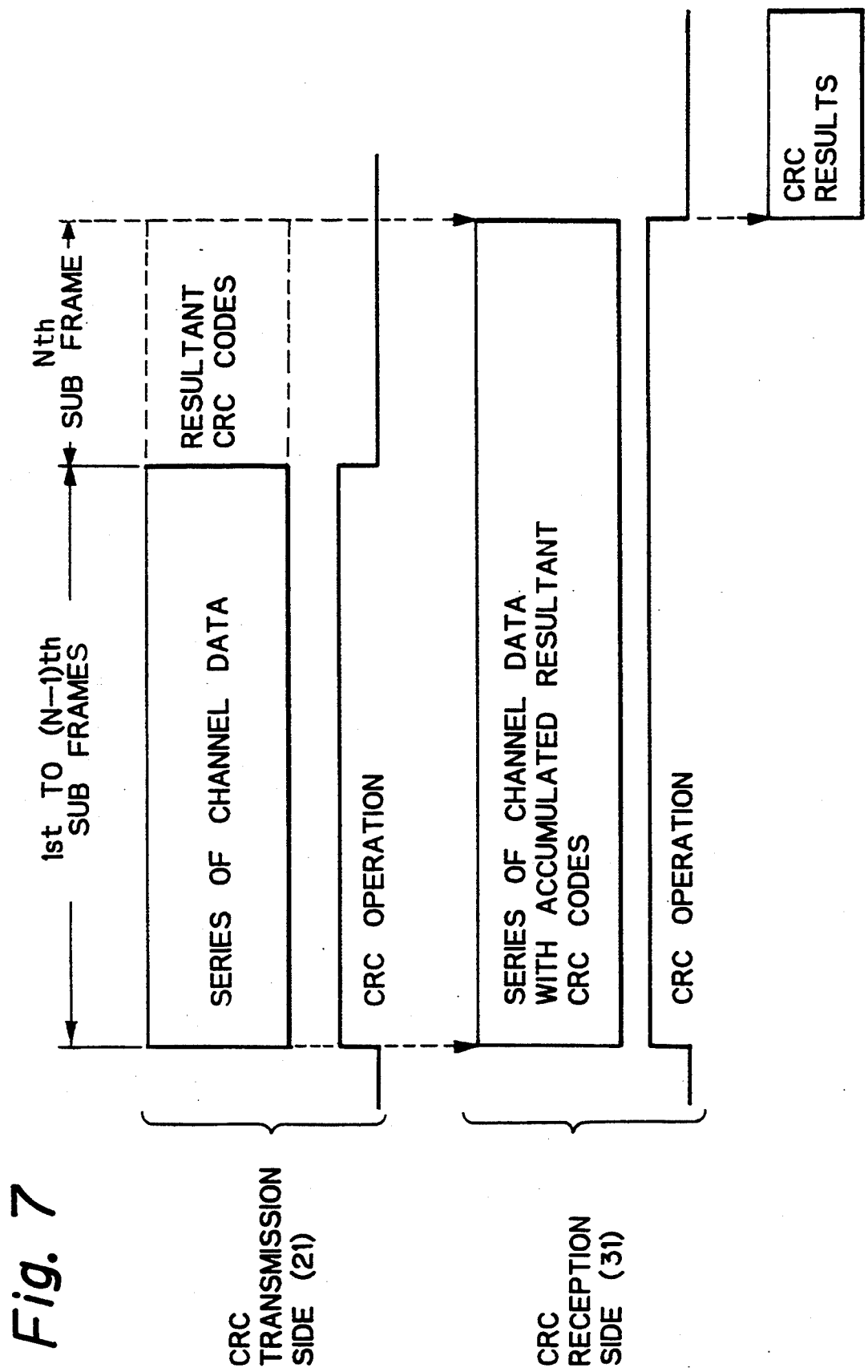
FIG. 7 is a view simply representing a CRC transmission and a CRC reception.

FIG. 7 is a view simply representing a CRC transmission and a CRC reception. In FIG. 7, at both the CRC transmission side (21) and the CRC reception side (31), the CRC arithmetic operation is carried out by the following equation.

$$D/G=R$$

The reference G denotes the generator polynominal, D denotes the channel data to be checked and divided by G, and R denotes a remainder of the above division. In the CRC transmission side, R represents the resultant CRC code, while in the CRC reception side, R represents the CRC results.

Figure 8:
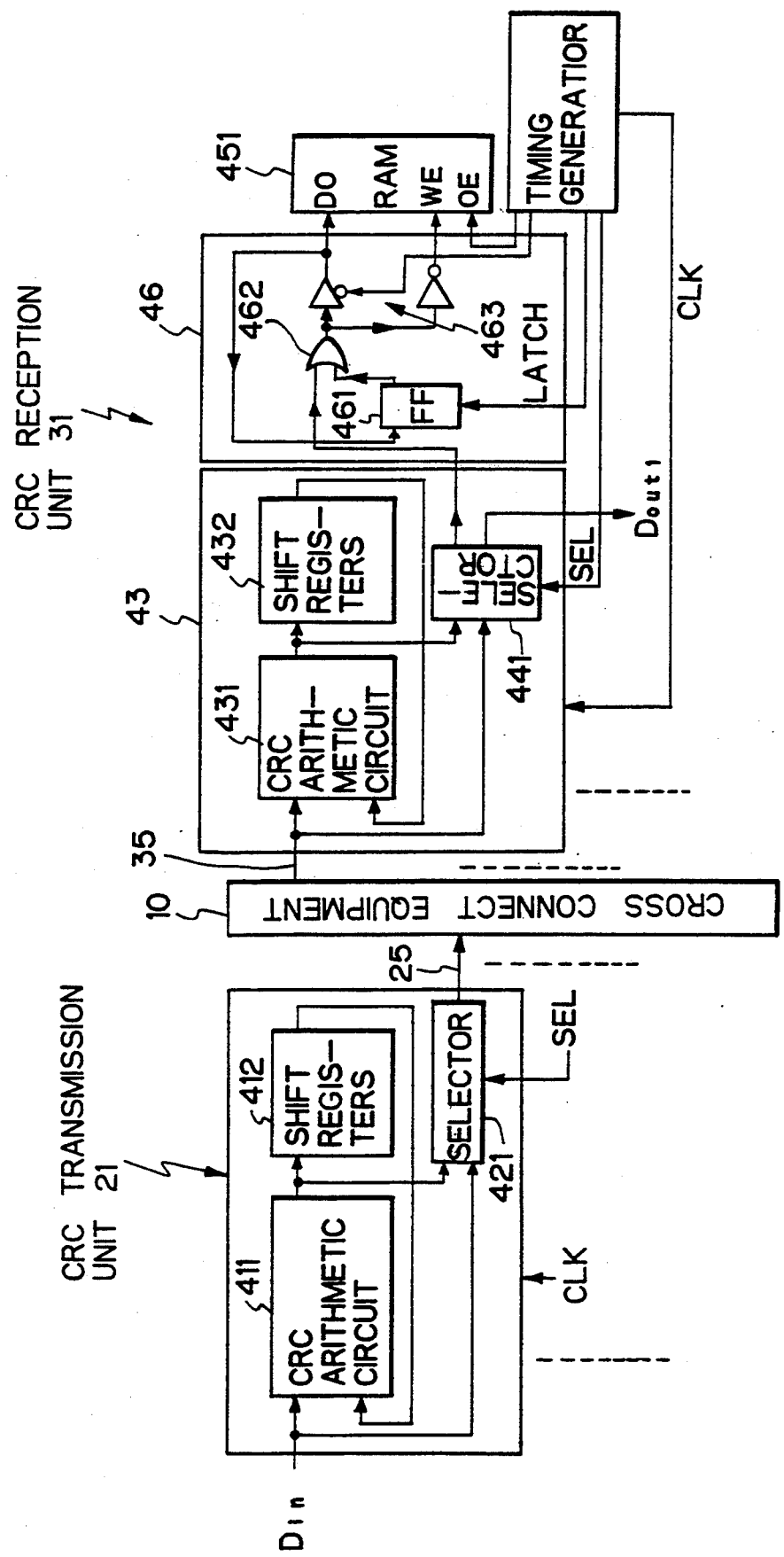
FIG. 8 illustrates a CRC system according to an embodiment of the present invention.

FIG. 8 illustrates a CRC system according to an embodiment of the present invention. In FIG. 8 the first means 41 (FIG. 4) is comprised of a CRC arithmetic circuit 411 receiving the series of incoming channel data and carrying out CRC operations thereon channel by channel to produce the resultant CRC codes for each channel successively, and series connected shift registers 412, in the same number as the number of the channels (CH1, CH2 ... CHM), to receive successively at its input the resultant CRC codes from the CRC arithmetic circuit 411 and provide successively at its output the shifted resultant CRC codes to feedback the same to the CRC arithmetic circuit 411.

The CRC arithmetic circuit 411 has at its input a logical adder (413 in FIG. 11) receiving both the series of the incoming channel data to be checked and the shifted resultant CRC codes from the output of the shift registers 412.

The second means 41 (FIG. 4) is comprised of a selector 421 receiving, at one of its inputs, the series of incoming channel data to be checked and, at the other input, the resultant CRC codes, and passes therethrough either one of the above two inputs selectively, such that the incoming channel data of the 1st sub frame through (N−1)th sub frame are selected sequentially first, and then the resultant CRC codes of the Nth subframe are selected to follow thereafter.

At the CRC reception unit 31 of FIG. 8, the third means 43 (FIG. 4) is comprised of a CRC arithmetic circuit 431 receiving the series of outgoing channel data followed by the resultant CRC codes and carrying out CRC operations thereon channel by channel to produce the CRC results for each channel successively, and series connected shift registers, in the same number as the number of channels, to successively receive at its input the CRC results from the above CRC arithmetic circuit 431 and successively provide at its output the shifted CRC results to feedback the same to the CRC arithmetic circuit 431.

The CRC arithmetic circuit 431 in the third means 43 has at its input a logical adder 433 (FIG. 2) receiving both the series of the outgoing channel data followed by the resultant CRC codes and the shifted CRC results applied from the output of the shift registers 432.

The fourth means 44 (FIG. 4) is comprised of a selector 441 receiving, at one of its inputs, the series of outgoing channel data followed by the resultant CRC codes, and at the other input, the CRC results, and selectively passes therethrough either one of the above two inputs such that the outgoing channel data of the 1st sub frame through (N−1)th sub frame are selected as Dout$_1$ sequentially first, and then the resultant CRC codes of the Nth subframe are selected to follow thereafter.

The fifth means 45 (FIG. 4) is comprised of a random access memory(RAM) 451.

The sixth means 46 (FIG. 4) includes a latch circuit(FF) 461 for storing the CRC result of each channel read from the corresponding address of the RAM 451 just before the CRC result is to be written thereto; an OR gate 462 receiving, on one hand, the output from the latch circuit 461, and on the other hand, the output from, at every Nth frame, the selector 441; and control gates 463 for controlling, on one hand, a write operation of the output from the OR gate 462, and on the other hand, a read operation from the RAM 451 to the latch circuit 461.

With the above construction, the CRC test is achieved in general by the following steps, i.e., (a) receiving the incoming channel data to be checked,
(b) applying CRC operations to respective channel data successively at each sub frame to obtain resultant CRC codes for each channel, while coupling each resultant CRC code obtained at the preceding sub frame with the channel data received at the present sub frame,
(c) forming a Nth sub frame to set up a main frame composed of N sub frames, the Nth sub frame containing the last resultant CRC codes of respective channels to be input to the cross connect equipment 10,
(d) receiving outgoing channel data to be checked having the format of the main frame,
(e) applying CRC operations to the thus received outgoing channel data successively in the same manner as in the above step (b) to obtain CRC results for each channel accumulated through the 1st sub frame to the Nth sub frame sequentially, and
(f) storing respective CRC results for each channel in the memory (RAM) 451, while holding a CRC error in each channel by the means 46, once a CRC error has occurred in any of the sub frames.

Figure 9B:
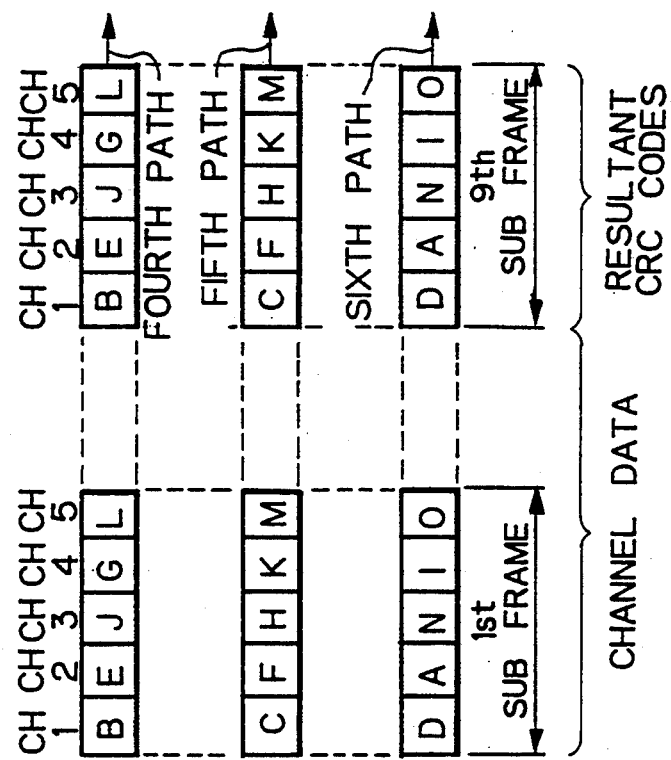
Figure 9C:
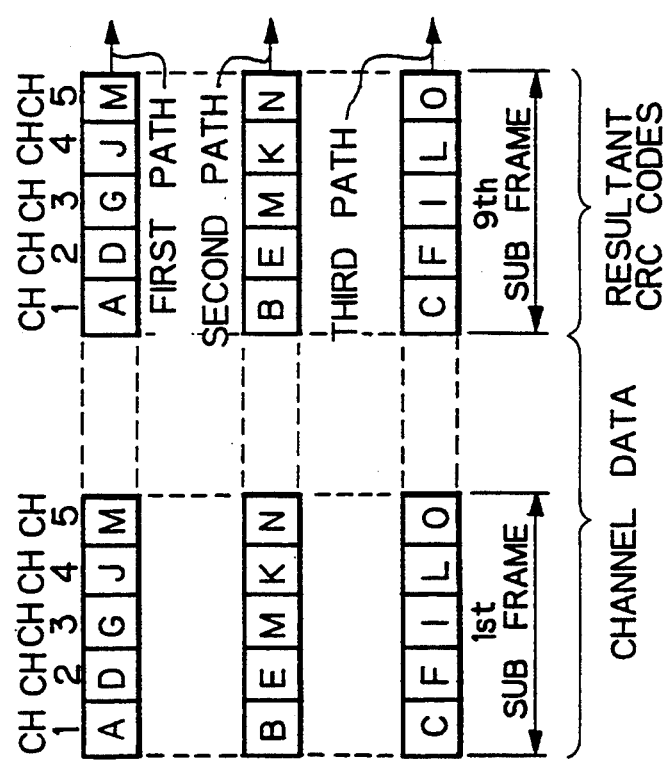
Figure 9D:
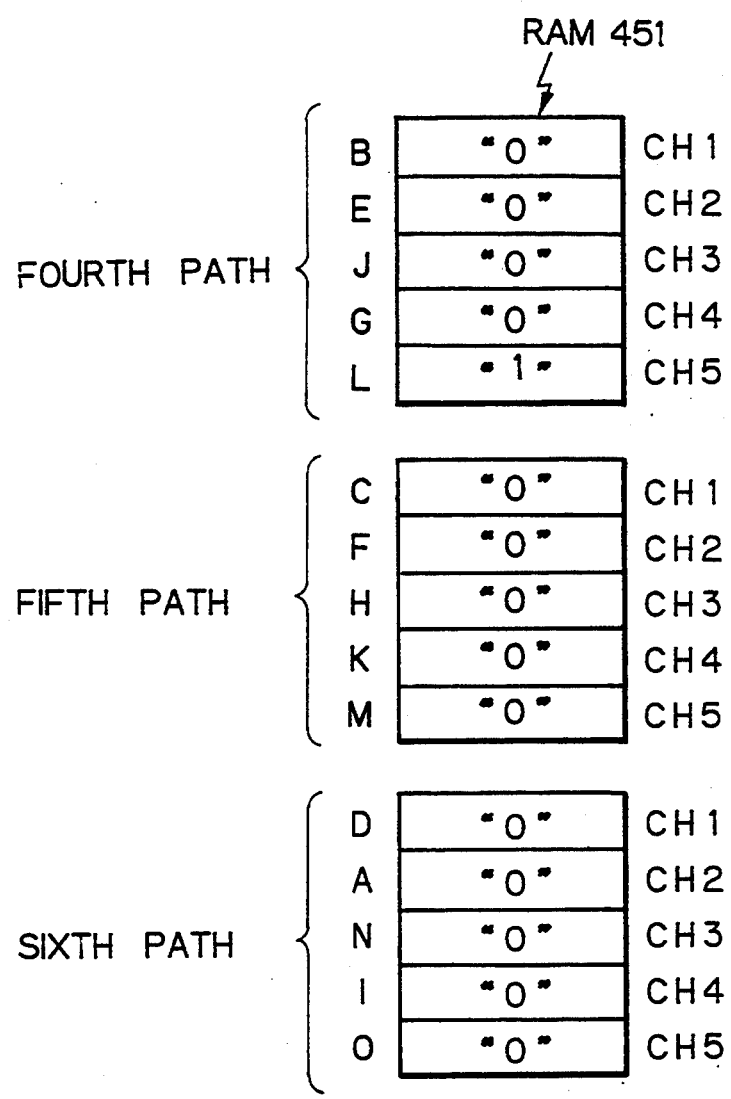
Figure 10:
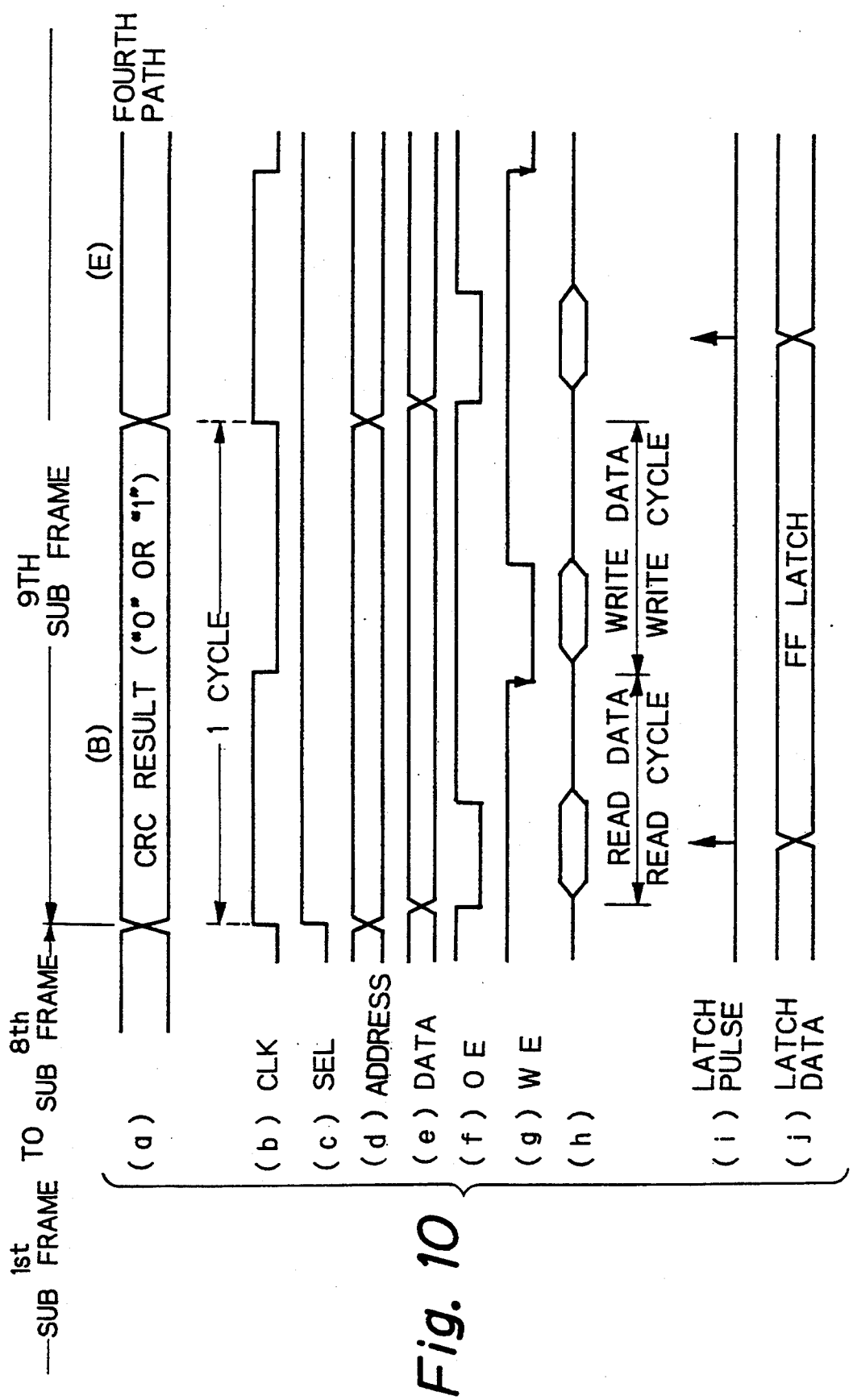
FIG. 10 depicts timing charts for explaining the operation achieved between the hold means 46 and the RAM 451 of FIG. 8.

FIGS. 9A, 9B, 9C and 9D depict signal formats for explaining the operation achieved in the CRC system of FIG. 8, and FIG. 10 depicts timing charts for explaining the operation achieved between the hold means 46 and the RAM 451 of FIG. 8. The operation of the CRC system shown in FIG. 8 will be more clarified with reference to FIGS. 9A to 9D and 10. In FIG. 8, the main frame is composed of nine sub frames as an example, as shown in FIG. 9A. Further, as seen from FIG. 9A, each sub frame is composed of 5 channels, as an example. The CRC operations are achieved for each channel (CH1 to CH5) independently through the first sub frame to the eighth sub frame, during which the inherent incoming channel data is input. Through the CRC operations, the resultant CRC codes can be sought and written in the resultant CRC code area at the 9th sub frame channel by channel, i.e., five times in this example.

Assuming that, on the first path, the channel data A, D, G, J and M are input through respective channels CH1 to CH5, respectively, as shown in FIG. 9B, the channel data is sequentially applied, in FIG. 8, to the CRC arithmetic circuit 411 and the selector 421. The CRC arithmetic circuit 411 executes the CRC operation for the thus applied channel data, i.e., A, D, G, J and M, independently and sequentially, as a whole. As a result of the CRC operations, the resultant CRC codes are sequentially input to the 5-stage shift registers 412 and stored therein.

At the next sub frame, the thus stored five resultant CRC codes for each channel (CH1 to CH5) are feedback to the CRC arithmetic circuit 411 sequentially to be coupled with the respective channel data now input at the present sub frame. The thus coupled channel data is then applied to the CRC arithmetic circuit 411 as before.

The above operation is repeated from the first sub frame to the eighth sub frame, whereby the final resultant CRC codes are obtained for each channel and are written in the resultant CRC code area at the ninth sub frame, i.e., the last sub frame of each main frame, and at the respective channels CH1 to CH5. Then, the five resultant CRC codes are given to the selector 421.

The selector 421 operates such that the input channel data of first through eighth sub frames is allowed to pass therethrough to reach the cross connect equipment 10 and, at the ninth sub frame, the aforesaid final resultant CRC codes for each channel are allowed to pass therethrough to reach the cross connect equipment (corresponding to upper row of FIG. 7). Each channel data provided with the resultant CRC code is distributed to the predetermined path as shown in FIG. 9C.

Taking the fourth path of FIG. 9C as an example, the outgoing channel data is supplied from the cross connect equipment 10, the outgoing channel data carrying inherent channel data for each channel through the first through eighth sub frames and the resultant CRC codes at each ninth sub frame. The first to eighth sub frames are input, as inherent channel data, to the CRC arithmetic circuit 431. The circuit 431 executes the CRC operations with respect to the channel data B, E, J, G and L and then the resultant CRC codes for each channel are sequentially stored in the 5-stage shift registers 432. At the next sub frame, the resultant CRC codes are feedback, channel by channel, to the CRC arithmetic circuit 431, as is done in the CRC transmission side. The last CRC operation is carried out by using the resultant CRC codes carried in the ninth sub frame to obtain the CRC results for each channel. At this time, in FIG. 8, the selector 441 selects the output of the CRC arithmetic circuit 431. The selection is made by a CRC selection signal SEL. The signal SEL is a signal shown in row (c) of FIG. 10. As known, if no CRC error exists, the CRC result assumes the logic "0", but, if a CRC error exists, the CRC result assumes the logic "1". The CRC result ("0" or "1") is then applied to one of the inputs of the OR gate 462. The output of the OR gate 462 is applied to the RAM 451.

In FIG. 8, the hold means 46 including the OR gate 462 operates at a speed twice the speed of the CRC arithmetic means (43). That is, as shown in row (h) of FIG. 10, the hold means 46 operates in a prior half cycle (read cycle) and a latter half cycle (write cycle) within every one cycle of a CRC clock CLK (see row (b) of FIG. 10).

The upper gate of the control gates 463 is put into, during the read cycle, a disabled state by a disable signal, and at the same time, an output enable signal (OE) from the timing generator is applied to the RAM. The signal (OE) is shown in row (f) of FIG. 10. At this time, the port DO acting as a dual port of the RAM 451 works as an output port to read the CRC result at the first channel CH1 (same as other channels), which CRC result was obtained in the preceding sub frame. The thus read preceding CRC result is given to the latch circuit (FF) 461 and held therein by a latch pulse "LATCH" for one cycle of the CLK. The latch pulse is shown in row (j) of FIG. 10 and the corresponding latch data is shown in row (j) of FIG. 10.

Thus the OR gate 462 receives both the output from the latch circuit 461 and the output from the selector 441. If the OR gate 462 receives the two inputs both at logic "0", the OR gate 462 outputs logic "0". If the OR gate 462 receives the two inputs, at least one of which is logic "1", the OR gate outputs logic "1". This output of the OR gate 462 is written in the next coming write cycle (see row (h) of FIG. 10), where the upper gate of the control gates 463 is put into an enabled state by an enable signal from the timing generator, and at the same time, the RAM 451 is ready for a write operation. Whether or not the RAM 451 writes the data from the OR gate 462 depends on the logic of this data. Namely, if the data of logic "1" is given, the port WE (Write Enable) of the RAM 451 receives logic "0" through the lower gate (inverter gate) of the control gates 463. As usual, the write enable port (WE) is active low, and therefore, if the data of logic "1" is given from the OR gate 462, the data can be written in the RAM 451.

Therefore, if the OR logic between the CRC result in the RAM 451 and the output from the selector 441 indicates logic "1", it becomes possible to write the logic "1" to the RAM 451. In other words, if no CRC error occurs in the CH1 during the main frame, the RAM 451 is not put into write mode, since the port WE receives logic "1" (high) only. As mentioned before, the port WE is an active low ("0") port.

The contents of the RAM 451 are shown in FIG. 9D as an example. If there is no CRC error in the channel data of CH1 through the first sub frame to the eighth sub frame, logic "0" remains at the address, corresponding to the CH1, in the RAM 451.

However, once a CRC error has occurred in, e.g., the channel CH5 (L), logic "1" is written at the address, corresponding to the CH5, in the RAM 451 (see FIG. 9D).

Once the logic "1" is written at the address, corresponding to the CH5 (same for other channels) in the RAM 451, this logic "1" is read from the RAM 451 in the prior half cycle (read cycle) and held in the latch circuit (FF) 461 for one cycle of the clock CLK. Therefore, even if logic "0" (indicating no CRC error) is given as the CRC result of CH5 at the following sub frame appearing at the corresponding input of the OR gate 462 leading to the selector 441, and is going to be given to the RAM 451 in the latter half cycle (write cycle), the logic "0" cannot be written in the RAM 451. This because, now the latch circuit 461 produces the logic "1" and the logic "1", on one hand, makes the port WE active, and on the other hand, is input to the port DO. That is, the logic "1" is overwritten in all the following write cycles. 10 In short, the hold means 46 cooperates with the RAM 451 to hold the CRC error information, during the main frame once the related CRC error occurs in any of the sub frames.

Figure 11:
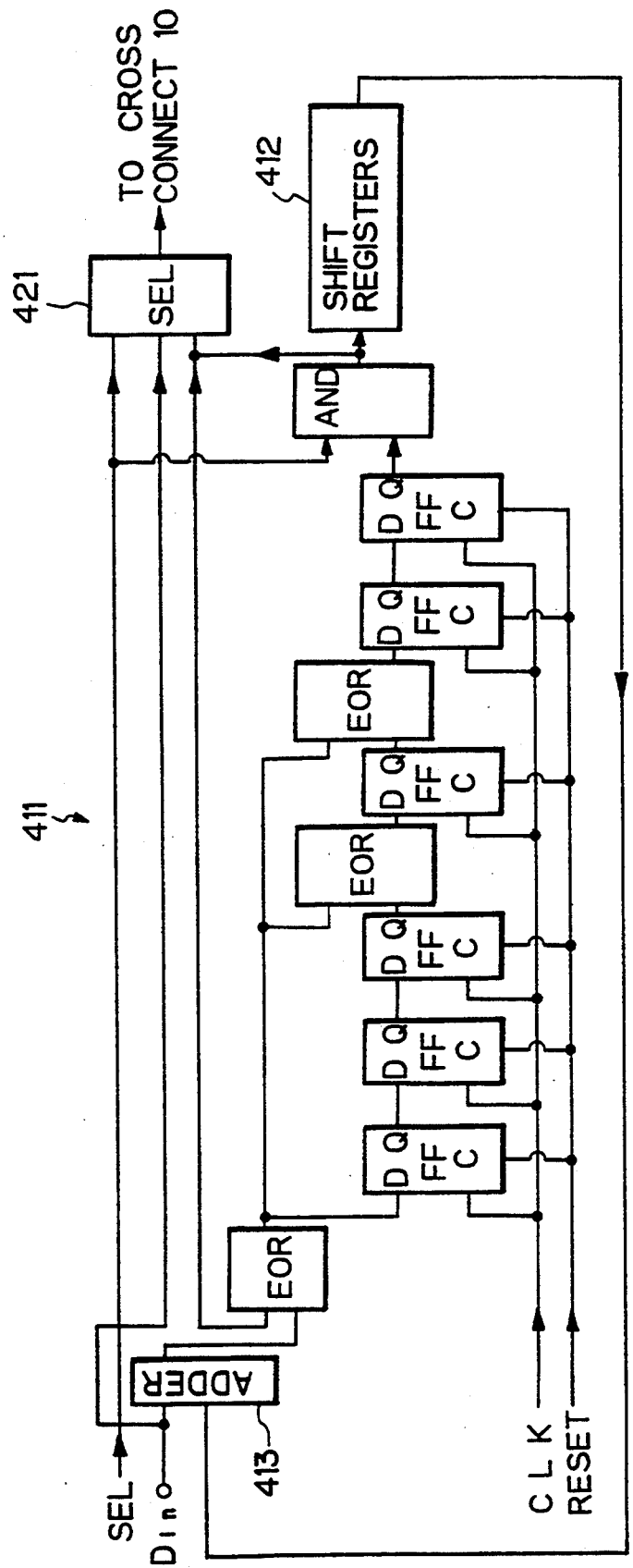
FIG. 11 is a detailed example of a CRC arithmetic circuit at the CRC transmission side.
Figure 12:
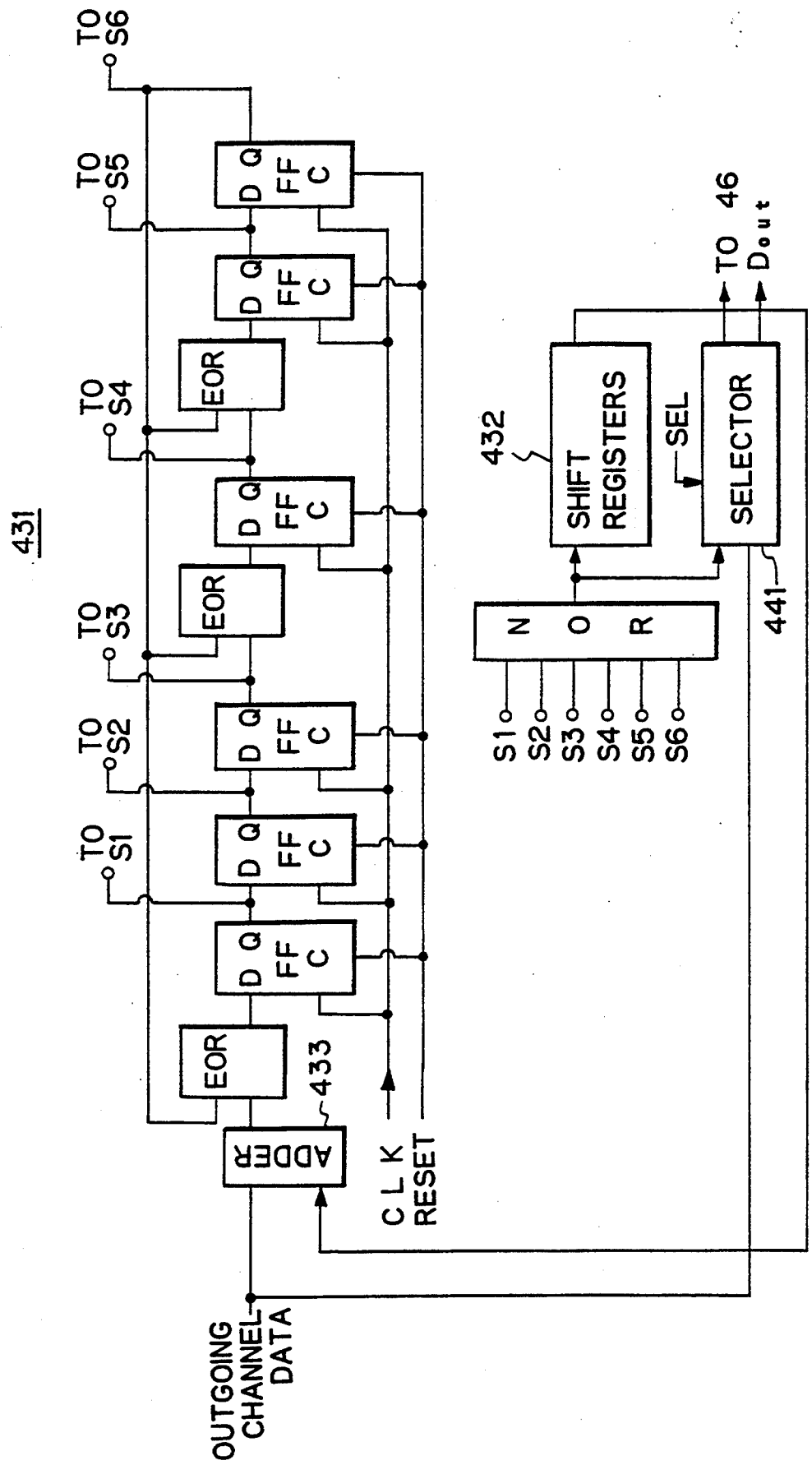
FIG. 12 is a detailed example of a CRC arithmetic circuit at the CRC reception side.

FIG. 11 is a detailed example of a CRC arithmetic circuit at the CRC transmission side and FIG. 12 is a detailed example of a CRC arithmetic circuit at the CRC reception side. In FIG. 11, the CRC arithmetic circuit 411 is comprised of D-flip flops (FF) and exclusive OR gates (EOR). Other members 412, 413 and 421 have already been explained. In FIG. 12, the CRC arithmetic circuit 431 is comprised of D-flip flops (FF), exclusive OR gates (EOR) and a NOR gate. Other members 432, 433 and 441 have already been explained.

As explained above in detail, the present invention provides a CRC system with a simple structure by realizing each CRC transmission and reception unit by a single arithmetic circuit 411 and a single arithmetic circuit 431 in common for a plurality of channels (CH1, CH2 . . . CHM).

We claim:

1. A CRC apparatus for application to a cross connect equipment operating on data arranged into main frames, each main frame being made up of a plurality N of sub frames and each said sub frame including a plurality of channels for data, comprising:
a CRC transmission unit and a CRC reception unit for connection at an incoming side and an outgoing side of the cross connect equipment, respectively, said CRC transmission unit including:
a first means operative to receive series of incoming channel data and to apply CRC operations thereto to obtain resultant CRC codes for respective channels independently and repeatedly through N−1 sub frames, each sub frame including the same number of channels, in each channel, a resultant CRC code which was produced by said first means at a preceding sub frame being coupled by said transmission unit to channel data received at a present sub frame, said CRC operations being carried out in every successive main frame, where N is a predetermined positive integer equal to or larger than 2; and a second means for receiving said resultant CRC codes and associated channel data from said first means and operative to select, during the series from a first sub frame to the (N−1)th sub frame, respective channel data to input to the cross connect equipment and operative to select, at the Nth sub frame, final resultant CRC codes of the respective channels produced from the N−1 sub frames, the series of channel data followed by said final resultant CRC codes for each channel being available for input to the cross connect equipment.

2. A CRC apparatus for plication to a cross connect equipment operating on data arranged into main frames each main frame being made of a plurality N of sub frames and each said sub frame including a plurality of channels for data comprising:

a CRC transmission unit and a CRC reception unit for connection at an incoming side and an outgoing side of the cross connect equipment respectively, said RC transmission unit including:

a first means operative to receive a series of incoming channel data and to apply CRC operations thereto to obtain resultant CRC codes for respective channels independently and repeatedly through N−1 sub frames, each sub frame including the same number of channels, in each channel, a resultant CRC code which was produced by said first means at a preceding sub frame being coupled by said transmission unit to channel data received at a present sub frame, said CRC operations being carried out in every successive main frame, where N is a predetermined positive integer equal to or larger than 2; and a second means for receiving said resultant CRC codes and associated channel data from said first means and operative to select during the series from a first sub frame to the (N−1)th sub frame, respective channel data to input to the cross connect equipment and operative to select, at the Nth sub frame, final resultant CRC codes of the respective channels produced from the N−1 sub frames, the series of channel data followed by said final resultant CRC codes for each channel being available input to the cross connect equipment, said first means including a CRC arithmetic circuit receiving said series of incoming channel data and carrying out CRC operations thereon channel by channel to produce said resultant CRC codes for each channel successively, and series connected shift registers, being the same in number as the number of said channels, to receive successively at its input the resultant CRC codes from the CRC arithmetic circuit and provide successively at its output the shifted resultant CRC codes to feedback the same to the CRC arithmetic circuit.

3. A CRC apparatus as set forth in claim 2, wherein said CRC arithmetic circuit has at its input a logic adder receiving both said series of said incoming channel data and said shifted resultant CRC codes from the output of said shift registers.

4. A CRC apparatus as set forth in claim 3, wherein said second means includes a selector receiving, at one of its inputs, said series of incoming channel data, and at the other input, said resultant CRC codes, and passes therethrough either one of the above two inputs selectively, such that the incoming channel data of the first sub frame through the (N−1)th sub frame are selected sequentially first, and then the resultant CRC codes of the Nth sub frame are selected to follow thereafter.

5. A CRC apparatus for application to a cross connect equipment operating on data arranged into main frames each main frame being made up of a plurality N of sub frames and each said sub frame including a plurality of channels for data, comprising:

a CRC transmission unit and a CRC reception unit for connection at an incoming side and an outgoing side of the cross connect equipment, respectively, said CRC transmission unit including:

a first means operative to receive a series of incoming channel data and to apply CRC operations thereto to obtain resultant CRC codes for respective channels independently and repeatedly through N−1 sub frames, each sub frame including the same number of channels, in each channel, a resultant CRC code which was produced by said first means at a preceding sub frame being coupled by said transmission unit to channel data received at a present sub frame, said CRC operations being carried out in every successive main frame, where N is a predetermined positive integer equal to or larger than 2; and a second means for receiving said resultant CRC codes and associated channel data from said first means and operative to select during the series from a first sub frame to the(N−1)th sub frame, respective channel data to input to the cross connect equipment and operative to select, at the Nth sub frame, final resultant CRC codes of the respective channels produced from the N−1 sub frames, the series of channel data followed by said final resultant CRC codes for each channel being available for input to the cross connect equipment, said CRC reception unit including:

a third means operative to receive said series of channel data followed by said resultant CRC codes generated and selected in said first and second means respectively, and operative to apply CRC operations thereto to obtain CRC results for respective channels independently and repeatedly through said N sub frames, in each channel, a CRC result which was produced by said reception unit at a preceding sub frame being coupled by said third means to the channel data at the present sub frame, said CRC operations being carried out in every successive main frame;

a fourth means operative to receive said channel data and CRC results from said third means and to select, during the series of the first sub frame to the (N−1)th sub frame, the respective channel data to be externally output and to select, at the Nth sub frame, the final CRC results of the respective channels;

a fifth means for receiving final CRC results from said fourth means and operative to store said respective CRC results of each channel; and a sixth means receiving said CRC results and operative to, once a CRC error is found as said CRC result, hold the CRC error at a corresponding channel in said fifth means.

6. A CRC apparatus as set forth in claim 5, wherein said third means includes a CRC arithmetic circuit receiving said series of outgoing channel data followed by said resultant CRC codes and carrying out CRC operations thereon channel by channel to produce said CRC results for each channel successively, and series connected shift registers, being the same in number as the number of said channels, to successively receive at its input the CRC results from the above CRC arithmetic circuit and successively provide at its output the shifted CRC results to feedback the same to the CRC arithmetic circuit.

7. A CRC apparatus as set forth in claim 6, wherein said CRC arithmetic circuit in said third means has at its input a logical adder receiving both said series of outgoing channel data followed by said resultant CRC codes and said shifted CRC results applied from the output of said shift registers in said third means.

8. A CRC apparatus as set forth in claim 7, wherein said fourth means includes a selector receiving, at one of its inputs, said series of outgoing channel data followed by said resultant CRC codes, and at the other input, the CRC results, and passes therethrough either one of the above two inputs selectively, such that the outgoing channel data of the 1st sub frame through the $(N-1)$th sub frame are selected sequentially first, and then the resultant CRC codes of the Nth subframe are selected to follow thereafter.

9. A CRC apparatus as set forth in claim 8, wherein said fifth means includes a random access memory (RAM).

10. A CRC apparatus as set forth in claim 9, wherein said sixth means includes;

a latch circuit for storing said CRC result of each said channel read from the corresponding address of said RAM just before said CRC result is to be written thereto;

an OR gate receiving, on one hand, the output from said latch circuit, and on the other hand, the output from, at every said Nth frame, said selector; and control gates for controlling, on one hand, a write operation of the output from said OR gate, and on the other hand, a read operation from the RAM to the latch circuit.

11. A method for achieving CRC operation with respect to data transferred from an incoming side of a cross connect equipment to an outgoing side thereof comprising the steps of:

(a) receiving incoming channel data, the incoming channel data being composed of a series of $N-1$ sub frames each composed of the same number of channels arranged in the same order, where N represents a predetermined positive integer equal to or larger than 2;

(b) applying CRC operations to respective channel data successively at each of the sub frames to obtain resultant CRC codes for each channel, and coupling each resultant CRC code obtained at the preceding sub frame with the channel data received at the present sub frame;

(c) forming an Nth sub frame to set up a main frame composed of N sub frames, the Nth sub frame containing the last resultant CRC codes of respective channels to be input to a cross connect equipment;

(d) receiving outgoing channel data having the format of said main frame;

(e) applying CRC operations to the received outgoing channel data successively in the same manner as in the above step (b) to obtain CRC results for each channel accumulated through the 1st sub frame to the Nth sub frame sequentially; and (f) storing respective CRC results for each channel in a memory, while holding a CRC error in each channel once a CRC error has occurred in any of the sub frames.

* * * * *